United States Patent [19]

Beilstein, Jr. et al.

[11] Patent Number: 5,055,898

[45] Date of Patent: Oct. 8, 1991

[54] DRAM MEMORY CELL HAVING A HORIZONTAL SOI TRANSFER DEVICE DISPOSED OVER A BURIED STORAGE NODE AND FABRICATION METHODS THEREFOR

[75] Inventors: Kenneth E. Beilstein, Jr., Essex; Claude L. Bertin, South Burlington, both of Vt.; John R. Pessetto, Fort Collins, Colo.; Francis R. White, Essex

[73] Assignee: International Business Machines Corporation, Armonk, N.Y.

[21] Appl. No.: 693,880

[22] Filed: Apr. 30, 1991

[51] Int. Cl.$^5$ .................... H01L 29/78; H01L 21/265
[52] U.S. Cl. .................................. 357/23.6; 357/23.7; 357/41; 357/50; 357/51; 357/55; 357/59; 357/68; 437/29; 437/49; 437/84; 437/913; 437/919
[58] Field of Search ............... 357/23.7, 23.6, 23.6 G, 357/41, 50, 51, 55, 59, 68; 437/29, 49, 84, 913, 919

[56] References Cited

U.S. PATENT DOCUMENTS

| | | |
|---|---|---|
| 4,507,171 | 3/1985 | Bhatia et al. |
| 4,728,623 | 3/1988 | Lu et al. |
| 4,799,990 | 1/1989 | Kerbaugh et al. |
| 4,816,884 | 3/1989 | Hwang et al. |
| 4,958,318 | 9/1990 | Harari ................................ 357/23.6 |

OTHER PUBLICATIONS

"Process for Making Contacts or Vias to High Density Fine Lines", IBM Tech. Discl. Bulletin, vol. 30, No. 8, Jan. 1988.

"Si-Gate CMOS Devices on a Si/CaF$_2$/Si Structure", IEEE Transactions on Electron Devices, vol. ED-34, No. 11, Nov. 1987, by H. Onoda et al.

Primary Examiner—Edward J. Wojciechowicz
Attorney, Agent, or Firm—Perman & Green

[57] ABSTRACT

A semiconductor memory cell, and methods of fabricating same, that includes a substrate (10) and a plurality of trench capacitors (12) formed at least partially within the substrate and dielectrically isolated therefrom. A silicon-on-insulator (SOI) region includes a silicon layer (16) that overlies an insulator (14). The silicon layer is differentiated into a plurality of active device regions, each of which is disposed above one of the electrically conductive regions. Each of the active device regions is coupled to an overlying first electrode, or wordline (20), for forming a gate node of an access transistor (1), to a second electrode, or bitline (32), for forming a source node of the access transistor, and to the underlying trench capacitor for forming a drain node of the access transistor. The wordline includes a pair of opposed, electrically insulating vertical sidewalls, and the source node and the drain node of each of the access transistors are each comprised of an electrical conductor disposed upon one of the vertical sidewalls. The array of memory cells further includes structure (11, 13) for coupling the active device regions to the substrate to reduce or eliminate a floating substrate effect.

28 Claims, 17 Drawing Sheets

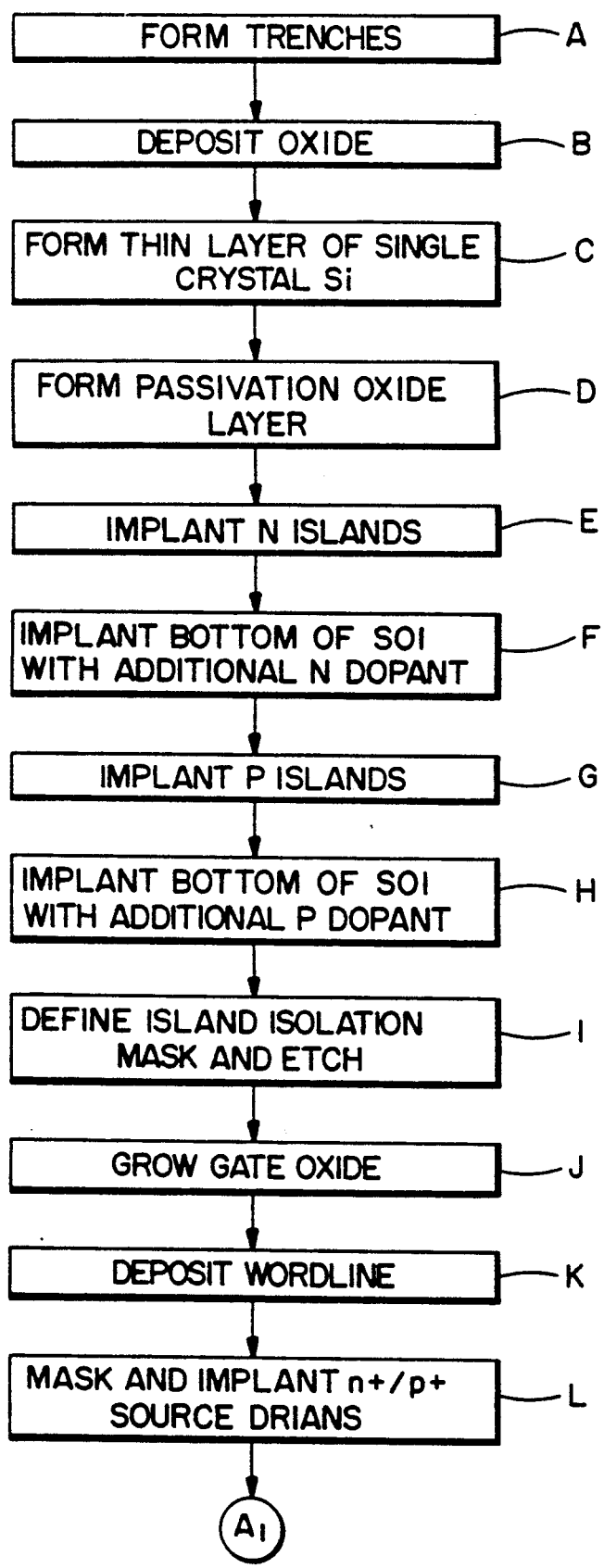

DRAM MEMORY CELL HAVING A HORIZONTAL SOI TRANSFER DEVICE DISPOSED OVER A BURIED STORAGE NODE AND FABRICATION METHODS THEREFOR

FIELD OF THE INVENTION

This invention relates generally to semiconductor memory cell structures and fabrication methods therefor and, in particular, to methods of fabricating an alignment insensitive dynamic random access memory (DRAM) cell having a trench capacitor structure and an access device fabricated in a silicon-on-insulator (SOI) overlayer. The invention also particularly relates to arrays of DRAM cells fabricated in accordance with the methods.

BACKGROUND OF THE INVENTION

In commonly assigned U.S. Pat. No. 4,816,884, issued Mar. 28, 1989, entitled "High Density Vertical Trench Transistor and Capacitor Memory Cell Structure and Fabrication Method Therefor" to Hwang et al., there is described a semiconductor memory cell structure that includes a vertical access transistor formed over a trench storage capacitor. A relatively shallow trench is disposed in an epitaxial layer over a deep trench. A neck structure extends from a top surface of the deep trench to a bottom surface of the shallow trench. Source regions are disposed in the epitaxial layer around the neck structure.

In commonly assigned U.S Pat. No. 4,728,623, issued Mar. 1, 1988, entitled "Fabrication Method for Forming a Self-Aligned Contact Window and Connection in an Epitaxial Layer and Device Structures Employing the Method", to Lu et al., there is described a method of forming a self aligned contact window through an insulator region. The contact window is shown to be useful in a source-to-trench connection that is formed by self-aligned lateral epitaxial growth.

In commonly assigned U.S. Pat. No. 4,507,171, issued Mar. 26, 1985, entitled "Method for Contacting a Narrow Width PN Junction Region", to Bhatia et al. there is described a method for making contact to a narrow pn junction region. A substantially horizontal conductive layer is employed to make contact to a substantially vertical layer so as to have the horizontal conductive layer in electrical contact with a pn junction. The method is said to be useful for fabricating a lateral PNP transistor.

In IBM Technical Disclosure Bulletin Vol. 30, No. 8 January 1988, entitled "Process for Making Contacts or Vias to High Density Fine Lines", Cronin describes a process for making lines of a width below a photolithographic resolution limit and a method for connecting such lines to preexisting contacts or lines.

It is an object of this invention to provide an improved high density dynamic random access memory cell structure.

It is another object of the invention to provide an improved memory cell structure that includes a trench capacitor and an access device formed within a silicon-on-insulator (SOI) region.

It is a further object of the invention to provide an improved DRAM cell that is substantially alignment insensitive, and wherein all images are at groundrule minimums.

A still further object of the invention is to provide a DRAM cell that employs a wordline sidewall contact structure with a buried storage trench capacitor, enabling a memory cell to be constructed within four unit areas.

Another object of the invention is to provide an improved DRAM cell that includes means for providing a substrate contact to a channel region of an SOI device so as to eliminate a floating substrate effect.

SUMMARY OF THE INVENTION

The objects of the invention are realized by a semiconductor memory cell, and by methods of fabricating same, that includes a substrate and a plurality of electrically conductive regions formed at least partially within the substrate and dielectrically isolated therefrom. A first layer, comprised of electrically insulating material, is formed over the substrate and over the electrically conductive region. A second layer, comprised of silicon, is formed over the first layer for providing a silicon-on-insulator overlayer. The second layer is differentiated into a plurality of active device regions, each of which is disposed above one of the electrically conductive regions. Each of the active device regions is coupled to an overlying first electrode, or wordline, for forming a gate node of an access transistor. Each of the active device regions is also coupled to a second electrode, or bitline, for forming a source node of the access transistor. Each of the active device regions is also coupled to the underlying electrically conductive region for forming a drain node of the access transistor. The wordline includes a pair of opposed, electrically insulating vertical sidewalls, and the source node and the drain node of each of the access transistors are each comprised of an electrical conductor disposed upon one of the vertical sidewalls. The array of memory cells further includes structure for coupling channels of the active device regions to the substrate to reduce or eliminate a floating substrate effect.

BRIEF DESCRIPTION OF THE DRAWING

The above set forth and other features of the invention are made more apparent in the ensuing Detailed Description of the Invention when read in conjunction with the attached Drawing, wherein:

FIGS. 1a and 1b depict semiconductor fabrication steps in accordance with a first processing method of the invention;

DETAILED DESCRIPTION OF THE INVENTION

Figure 2B:
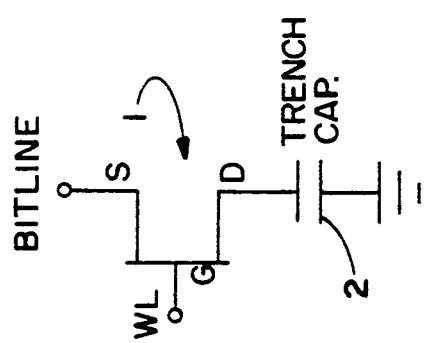
FIG. 2b is a schematic diagram of one memory cell of an array of memory cells, the memory cell including an access device and a trench capacitor.

As depicted in the schematic diagram of FIG. 2b, the three embodiments of the invention disclosed herein provide an alignment insensitive DRAM cell that utilizes a surface SOI transfer device 1 with a buried trench storage capacitor 2. A source terminal (S) of the access device 1 is coupled to a bitline contact, a gate terminal (G) is coupled to a wordline (WL) contact, and a drain terminal (D) is coupled to a node of the trench capacitor 2. The trench capacitor 2 is dielectrically coupled to a grounded silicon substrate. Through the use of a sidewall contact structure the one transistor DRAM cell provides one bit of information storage within four unit areas, as compared to the eight unit areas required for a conventional DRAM cell. One unit area is considered to be an area having edges of one unit length, where a unit length corresponds to a minimum photolithographic groundrule resolution.

A minimum cell size possible in a standard wordline cell configuration is 0.98 microns$^2$ for a minimum groundrule of 0.35 microns. The wordline pitch dimension includes one half of a shared contact, a wordline, a drain, a passing wordline and another one half of a shared contact, i.e. four minimum groundrule units, which is 4×0.36 microns, or 1.4 microns in length. The bitline pitch dimension includes the device and an isolation space. The bitline pitch dimension is thus two times 0.35 microns, or 0.7 microns.

The first method disclosed below enables a memory cell layout within one half of the area of a standard passing-wordline minimum cell area. This is accomplished by compressing the length of the memory cell, in the wordline pitch dimension, to two groundrule units. The bitline pitch dimension is maintained at two minimum wordline dimensions so that the minimum cell area, for a 0.35 micron ground rule, is 0.7×0.7 microns, or 0.49 microns$^2$.

Figure 1B:
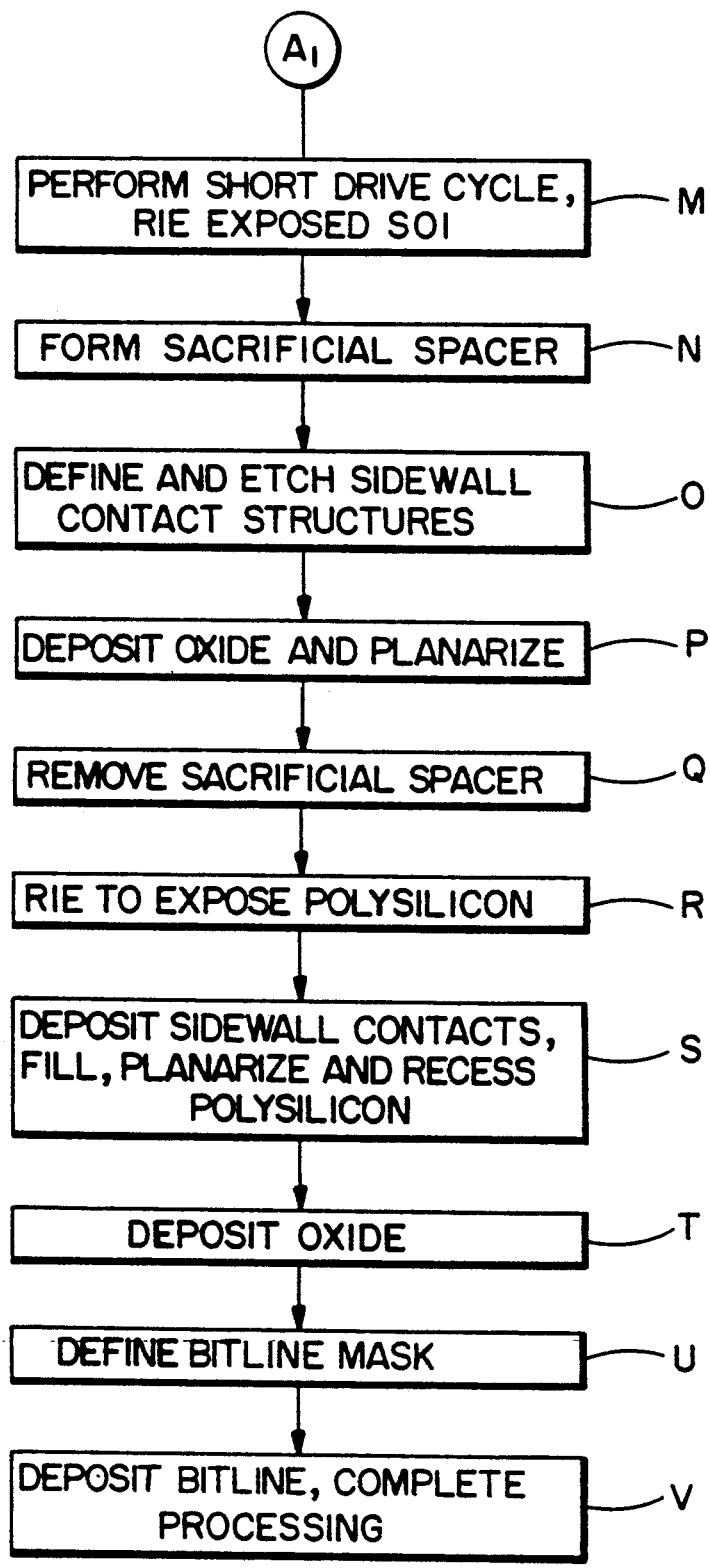

In regard to a first embodiment of the invention, reference is made to the flowchart of FIGS. 1a and 1b for showing fabrication steps that are described in detail below. In general, the fabrication steps form a deep charge storage trench that is buried beneath an oxide layer. On top of this structure a silicon-on-insulator (SOI) layer is formed to provide an active device region. The subsequent fabrication of sidewall contacts enables the compression of the memory cell into two minimum groundrules in each dimension. An SOI island interconnect technique is also disclosed.

It is pointed out that the dimensions referred to herein are typical dimensions for present processing technology. However, the invention is not to be construed to be limited to only devices fabricated with these dimensions, as it is expected that device dimensions will be further reduced by advances in processing technology. Also, it is within the scope of the invention to provide devices having smaller surface areas and deeper trenches than those disclosed below.

Step A. A first step defines, etches, fills and planarizes trench charge storage nodes or capacitors 12 within a p-type monocrystalline silicon substrate 10. The trenches have a depth of approximately six to nine microns, a top surface area dimension of approximately 0.8 microns on a side, and are filled with, by example, boron-doped p-type polysilicon. During the trench fabrication process the thickness of an oxide layer, that defines the trench opening, results in the trench polysilicon extending above the surface of the substrate 10 to a height of approximately 2000 Angstroms. The inner surfaces of the trench are lined with a suitable dielectric material, such as $SiO_2/Si_3N_4/SiO_2$.

Step B. A next step deposits a relatively thick (e.g. 200 nm) oxide layer 14 over the trench storage nodes 12.

Step C. Employing a SOI bonding and etchback technique there is produced a thin layer 16 (e.g. 150 nm) of single crystal Si over the oxide layer 14 and the underlying trench storage nodes 12. A suitable method for forming the SOI overlayer is described in an article entitled "Silicon-On-Insulator (SOI) by Bonding and Etch-Back"; by J. B. Lasky, et al., presented at IEDM Conference, Dec., 1985.

Step D. The SOI layer 16 is protected by the formation of an oxide layer 18. Layer 18 also serves as an isolation oxide later in the process.

Step E. The surface of the SOI layer 16 is implanted to form N-well regions at desired locations within the SOI layer 16, for p-channel devices, with the use of a block mask. Suitable implant species include arsenic or phosphorus and a suitable concentration is approximately $10^{15}$ atoms/cm$^3$.

Step F. Using the same mask, the bottom portion of the SOI N-well regions, the portion nearest to the oxide layer 14, is implanted with additional n-type dopant to a concentration of approximately $10^{17}$ atoms/cm$^3$. This additional n-type dopant acts later in the process to interconnect to active device channel regions, of p-channel devices, through one or more substrate contact vias positioned near terminal ends of subsequently formed wordlines.

Step G. P-well regions are implanted at desired locations within the SOI layer 16, for n-channel devices, with the use of a second block mask. A suitable implant species includes boron and a suitable concentration is approximately $10^{15}$ atoms/cm$^3$.

Step H. Using the same mask, the bottom portion of the SOI P-well regions, the portion nearest to the oxide layer 14, is implanted with additional p-type dopant to a concentration of approximately $10^{17}$ atoms/cm$^3$. The additional p-type dopant acts later in the process to interconnect to the channel region of n-channel devices.

Step I. An SOI island isolation mask is defined and the layer of isolation oxide 18 is etched. This island isolation mask defines linear patterns 18a of isolation oxide that run parallel to subsequently formed bitlines, the oxide patterns being aligned to a space between the buried trench storage nodes 12. That is, the linear oxide patterns 18a run orthogonally beneath subsequently formed wordlines and serve to differentiate active devices one from another along a length of a subsequently formed stripe of SOI that lies beneath a subsequently formed wordline.

Step J. A layer of gate oxide 19 is formed over the top surface of each silicon island.

Step K. Wordlines 20 are defined, deposited, and capped with 300 nanometers of oxide prior to masking. A passivation spacer 22 having a thickness of, for example, 50 nm is formed over the wordlines 20 and Reactive Ion Etched (RIE'd) such that the wordlines 20 are each encapsulated with oxide and the surface of the SOI silicon layer 16 between wordlines is exposed. The wordlines 20 are positioned to overlie the trenches in an offset manner, as shown in FIG. 3, such that a subsequently defined vertical contact to the underlying trench capacitor 12 is positioned adjacent to the spacer 22 that covers the wordline 20 sidewall.

Step L. Next, employing a blocking mask n+ source/drains are implanted into the exposed SOI surface. Also, p+ source/drains, if required, are implanted via a block mask.

Step M. A thermal anneal drive cycle is performed to activate the dopant and out-diffuse the dopant under the spacer 22. This provides overlap with the adjacent overlying wordline to assure proper FET operation. Next, the exposed portions of the isolation oxide 18 and the exposed SOI silicon 16, that is the portion not covered by a wordline 20, are RIE'd and removed. This results in a linear strip or stripe 16a of SOI silicon underlying each of the wordlines 20. Each stripe 16a has a plurality of spaced apart active devices separated from one another along the length of the wordline 20 by portions of the previously defined (Step I) linear oxide patterns 18a. Regions where a conventional source/drain are desired, such as at the periphery, are protected with a suitable block mask. Because of the second, deeper implantation steps described above a bottom region of each SOI stripe 16a functions as a substrate contact for providing charge carriers to active device channels disposed along the stripe 16a of SOI silicon.

Figure 3:
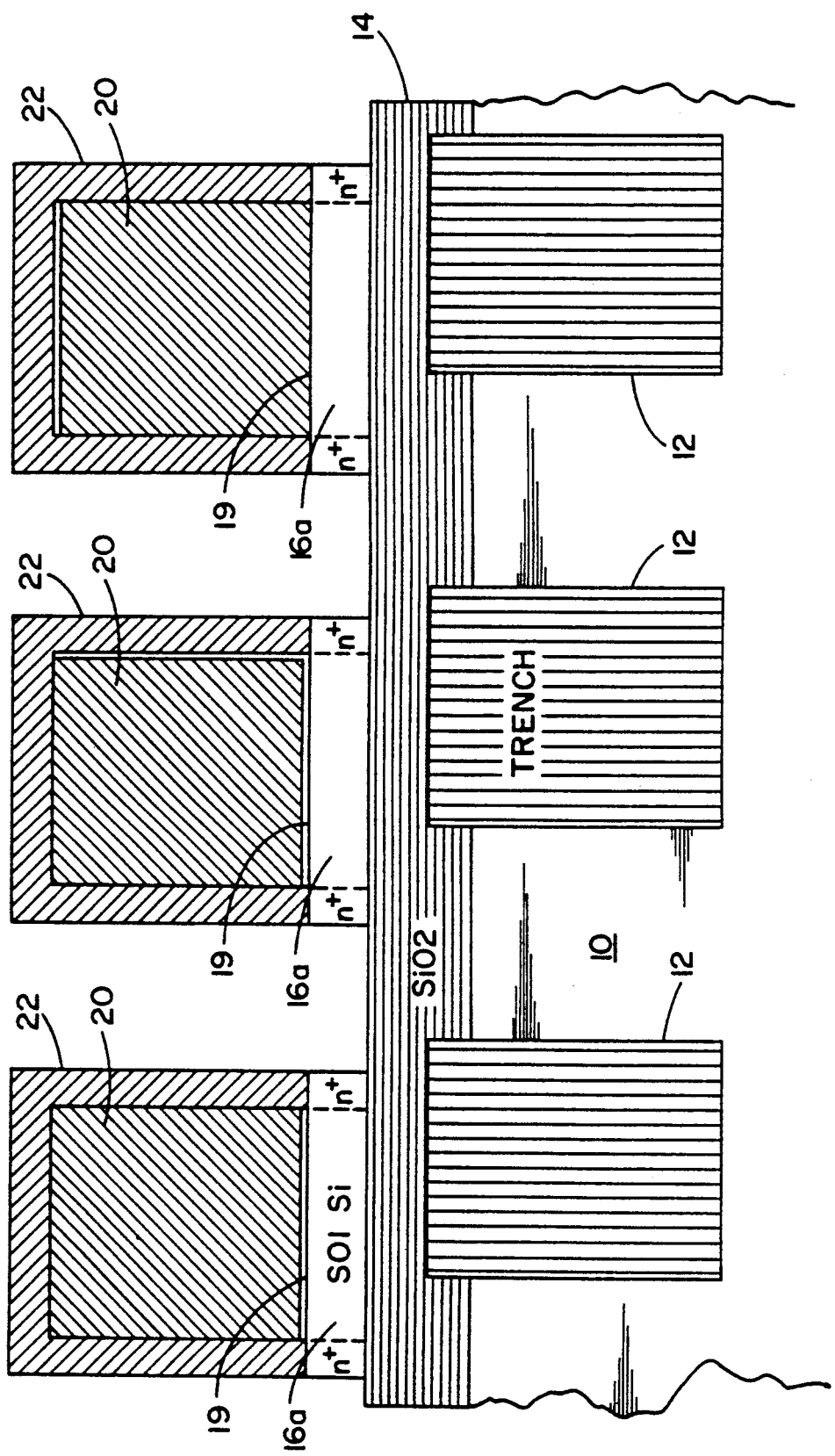
FIGS. 3-8 depict cross-sectional views showing the DRAM cell of the invention after various processing steps, with FIG. 8 showing a portion of an array of completed DRAM cells.

The cross-sectional view of FIG. 3, taken through an active device, depicts the construction of the device after the completion of Step M and shows n+ regions that were driven under the spacer 22 by the thermal anneal.

Step N. A sacrificial spacer 24 is formed which eventually defines the placement of the sidewall contacts to both the source and drain of the transfer device. Since the passivation spacer 22 must not be dissolved upon subsequent removal of the sacrificial spacer 24, the material of the sacrificial spacer 24 must be different than the passivation spacer 22 already on the wordline 20. One suitable material system to achieve this goal is the use $SiO_2$ for the passivation spacer 22 and $Si_3N_4$ for the sacrificial spacer 24.

Step O. A sub-optical, image reversed Sidewall Image Transfer (SIT) mask is aligned to the trench space along the intended bit line direction and is, therefore, also aligned to the previously defined isolation oxide from Step I. A method of using this type of mask is disclosed in commonly assigned U.S. Pat. No. 4,799,990, filed Jan. 24, 1987, entitled "Method of Self-Aligning a Trench Isolation Structure to an Implanted Well Region", by Kerbaugh et al., the disclosure of which is incorporated by reference herein in its entirety.

Figure 4:
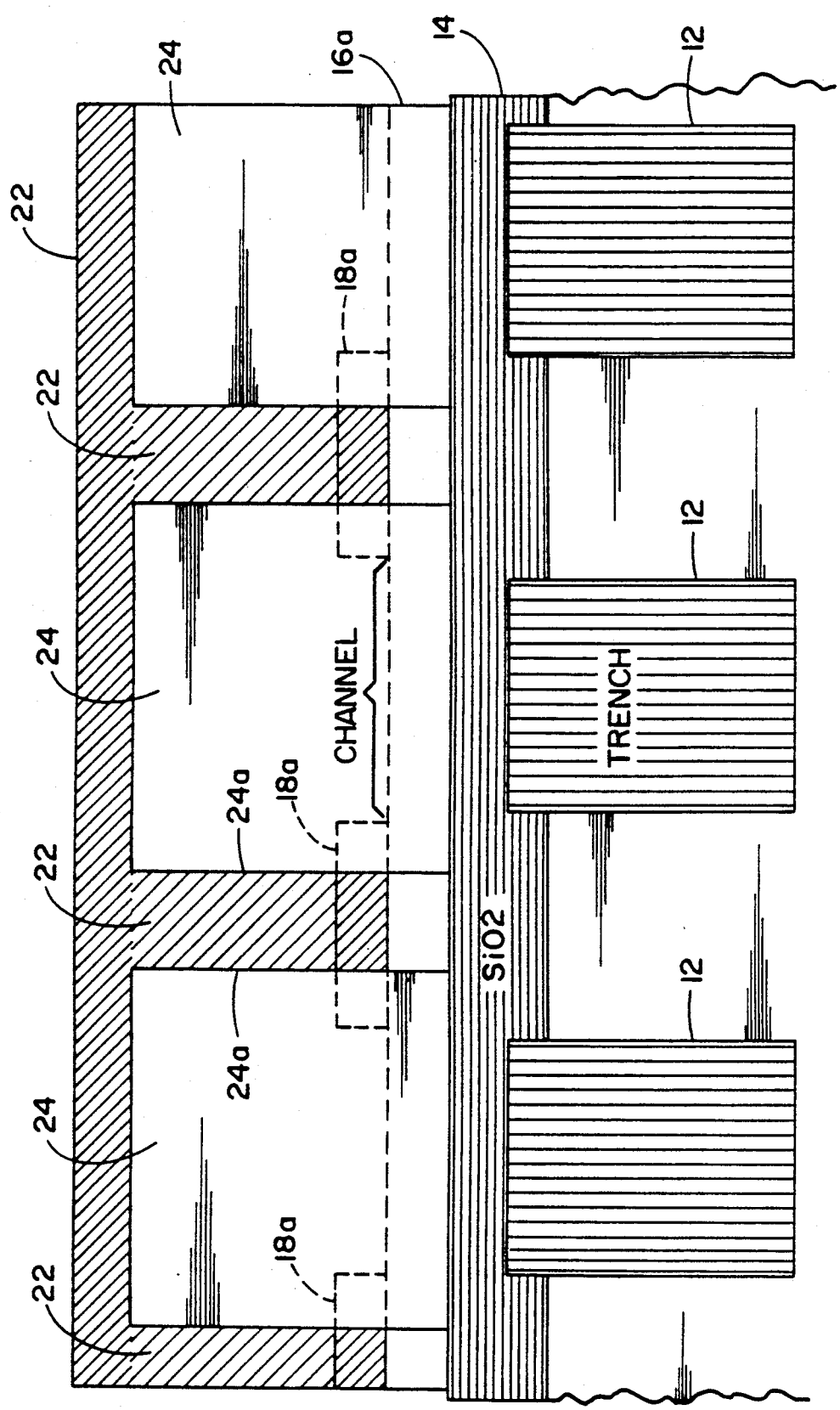

The SIT mask is employed to cut the sacrificial spacer 24 so that during subsequent sidewall contact formation all of the sources and drains along the wordline are not shorted together. The sub-optical image allows for overlay tolerances between the sidewall contact and the isolation oxide. That is, it assures that there is a full width to the transfer device channel. FIG. 4 shows an orthogonal cross-sectional view taken along the edge of the wordline 20 and demonstrates the sub-lithographic cuts 24a. The portion of the strip 16a of SOI silicon that underlies the wordline, and that is behind the remaining sacrificial spacer material, is shown in dashed outline, as is the portion of the isolation oxide 18a.

Figure 5:
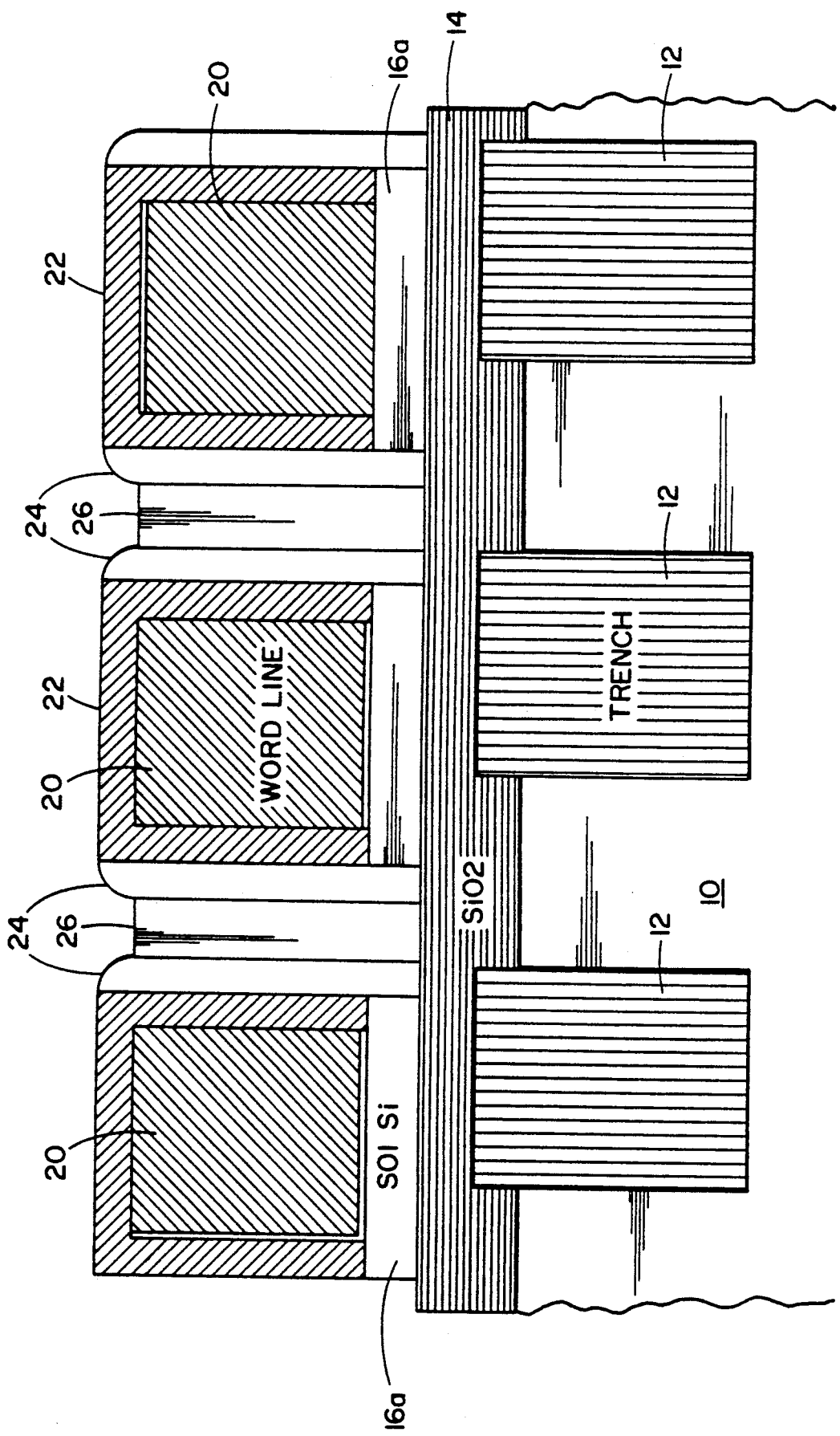

Step P. The remaining gaps in the memory cell array are filled with a conformal insulator material 26, which may be comprised of the same material as the original passivation spacer material. As shown in FIG. 5, the conformal insulator material 26 is planarized such that the top of the sacrificial spacer 24 is exposed. An additional mask may be required to remove this layer in the periphery of the memory cell array.

Step Q. The exposed portion of the sacrificial spacer 24 is removed with an appropriate etchant. In accordance with the example given thus far, one suitable etchant that etches $Si_3N_4$ but not $SiO_2$ is hot $H_3PO_4$.

Figure 6:
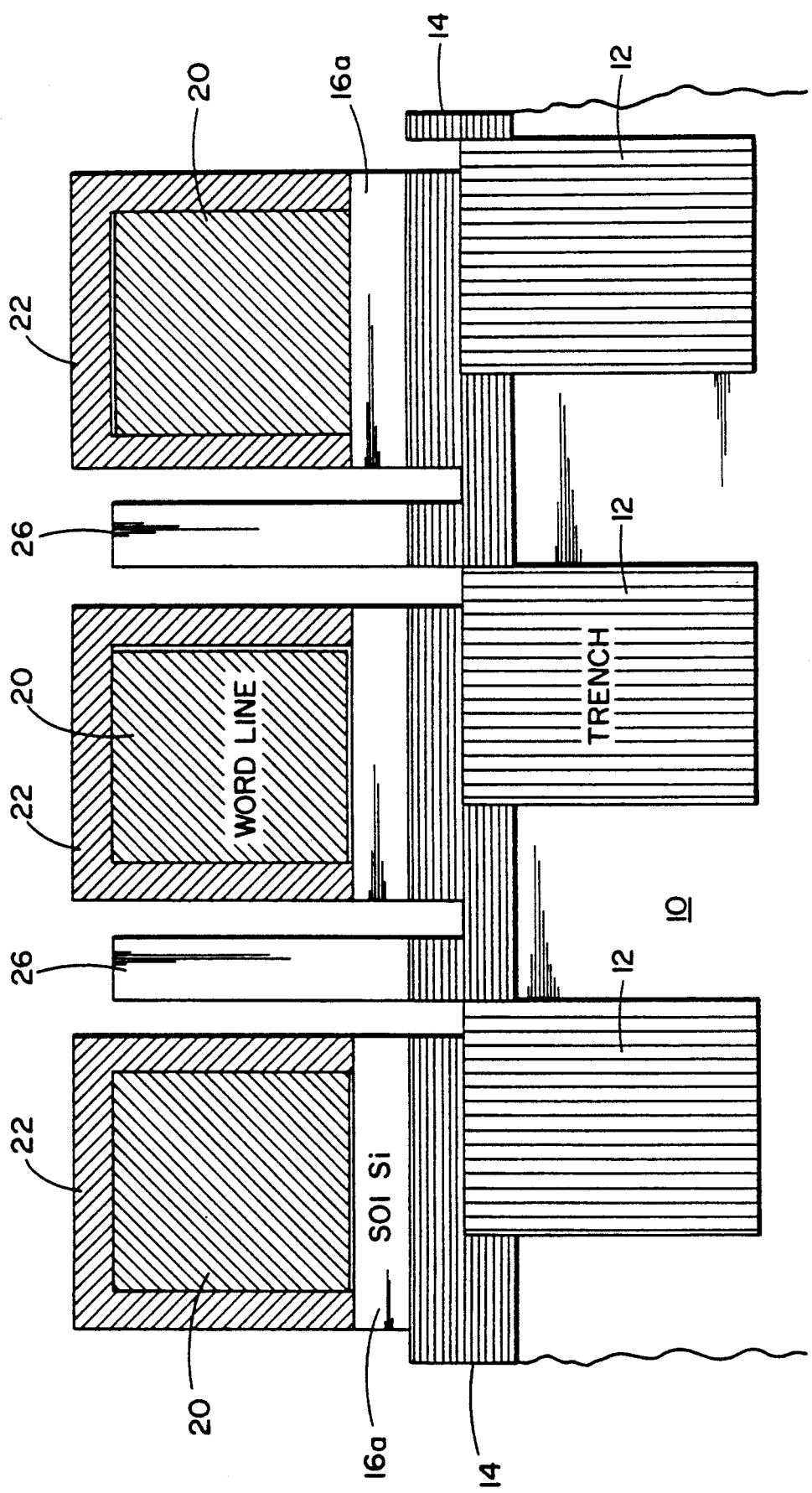

Step R. A RIE is employed next to etch the oxide on the buried trench storage nodes 12, thus exposing the polysilicon within the trench. The alignment of each of the wordlines 20 to the underlying trench 12 allows the opening of a contact only to the drain of the access device, as shown in FIG. 6. In that the upper region of the buried trench nodes 12 extend up into the oxide 14, the etch on the opposite side of the wordline 20, that is the etch to form the source contact, terminates within the oxide layer 14 and does not reach the substrate 12.

Figure 7:
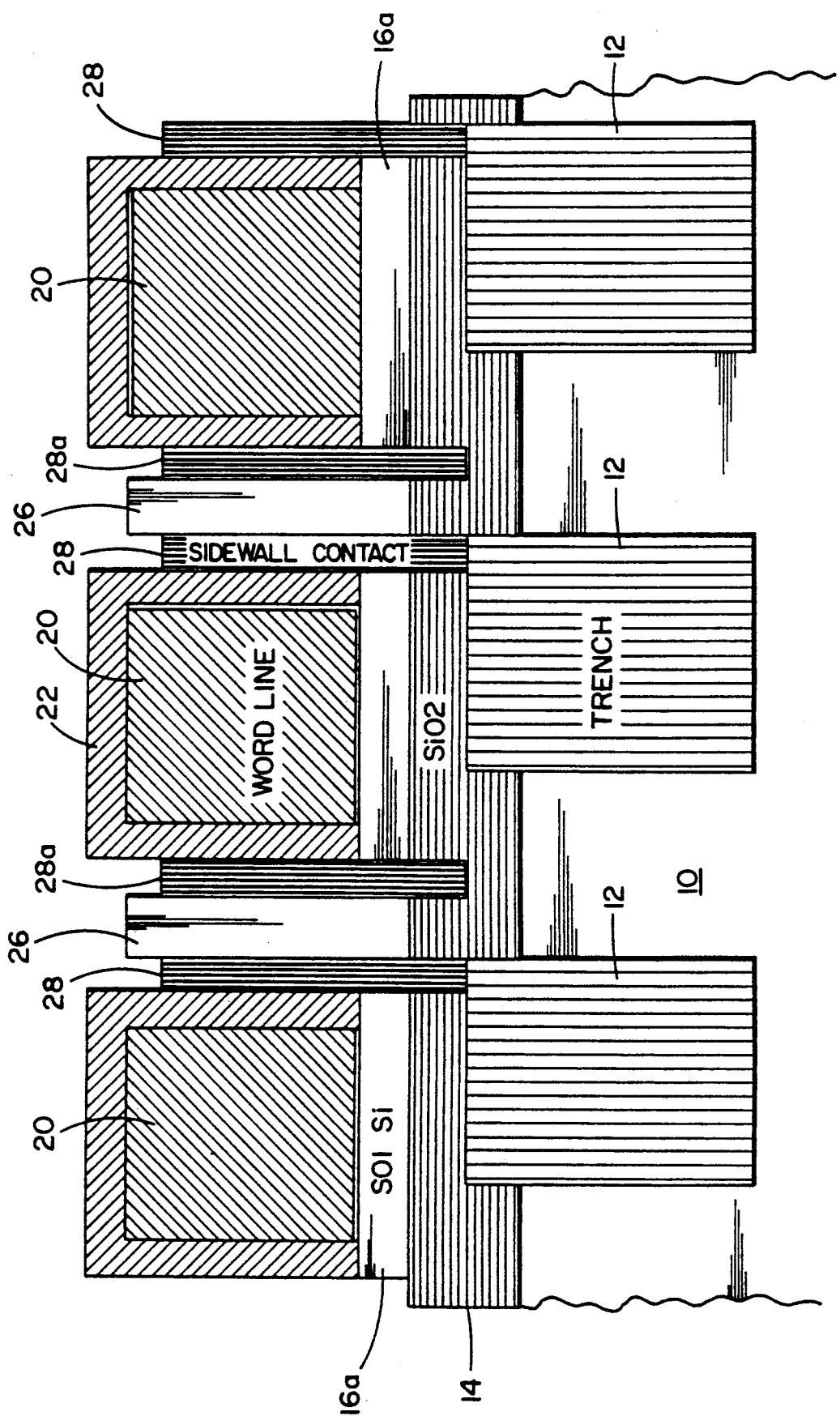

Step S. Next, the sidewall contacts 28 are formed. This step is accomplished by depositing a conformal conductive film, such as polysilicon, to refill the spacer gaps and then planarizing and recessing the film as shown in FIG. 7. As can be seen, the SOI silicon stripe 16a is electrically connected to the film within each trench 12. A contact 28a for a subsequently formed bitline is bought up to approximately the top of the wordline 20.

Step T. An additional layer 32 of passivation oxide is next deposited.

Step U. A mask is patterned so as to etch the oxide layer 32 to expose the sidewall bitline contact 28a. Preferably, the thickness of the oxide is selected to allow this step to be accomplished within the overlay tolerance of the selected technology.

Figure 8:
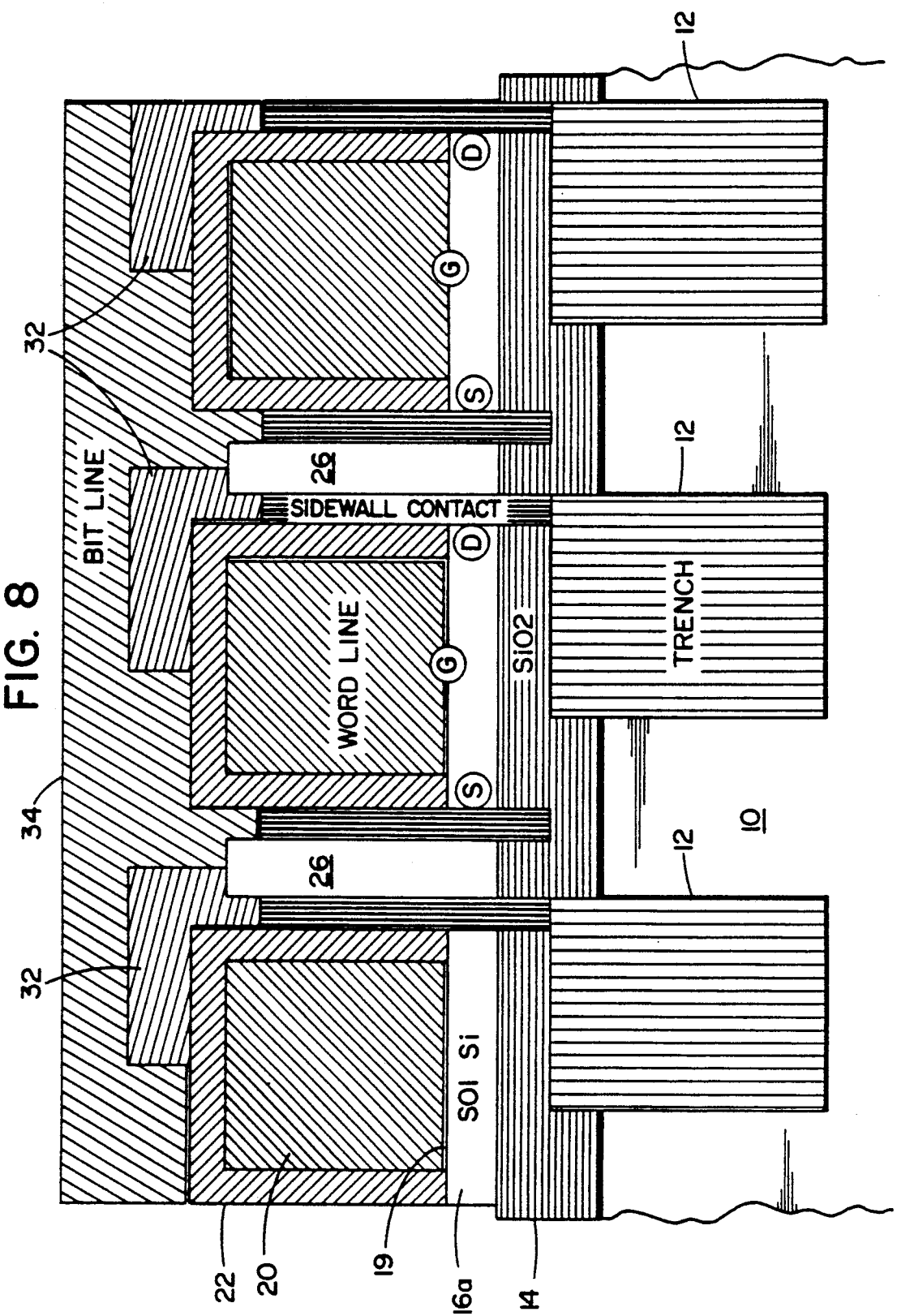

Step V. Finally, a conductor is deposited to form a bitline contact 34 so as to provide the structure shown in FIG. 8. All subsequent processing of the memory array is conventional in nature.

The advantages provided by this first processing embodiment of the invention are several. First, this embodiment realizes all of the advantages inherent in the use of SOI, including low parasitic capacitances, improved isolation, butting of N-Wells to P-Wells, etc. Second, there is provided an alignment insensitive cell such that all photolithographic images are at groundrule minimums. Third, there is provided a mechanism for contacting the channel region of the SOI transfer device, by means of the additional implant to the bottom of the SOI, thereby eliminating a floating substrate effect that is known to occur in some conventional SOI devices. And, a sidewall contact structure is employed synergistically with the buried charge storage trench 12 so as to allow the minimum cell size to be reduced by a factor of two with respect to a conventional passing-wordline configuration.

Having described the first embodiment of the invention, there is now described a second embodiment that provides an improved source of electrons to the silicon islands and therefore further eliminates the floating channel effect. This improvement provides conventional device characteristics while maintaining many of the benefits of SOI.

As was previously stated, the first embodiment of the invention utilizes a linear pattern, or "stripe", of SOI silicon that is self-aligned to and runs beneath the wordline 20 to act as a substrate 10 contact and as a source of electrons to the channel region of the transfer device. The stripe also provides the same benefit to support circuits. However, the transfer devices may deplete the channel, and it may occur that devices part-way down the wordline 20 are isolated from a power supply and exhibit the floating substrate effect. That is, a portion of the stripe may be cut-off from an associated power supply due to depletion regions of the devices reaching through the stripe to the buried SOI oxide.

Figure 10:
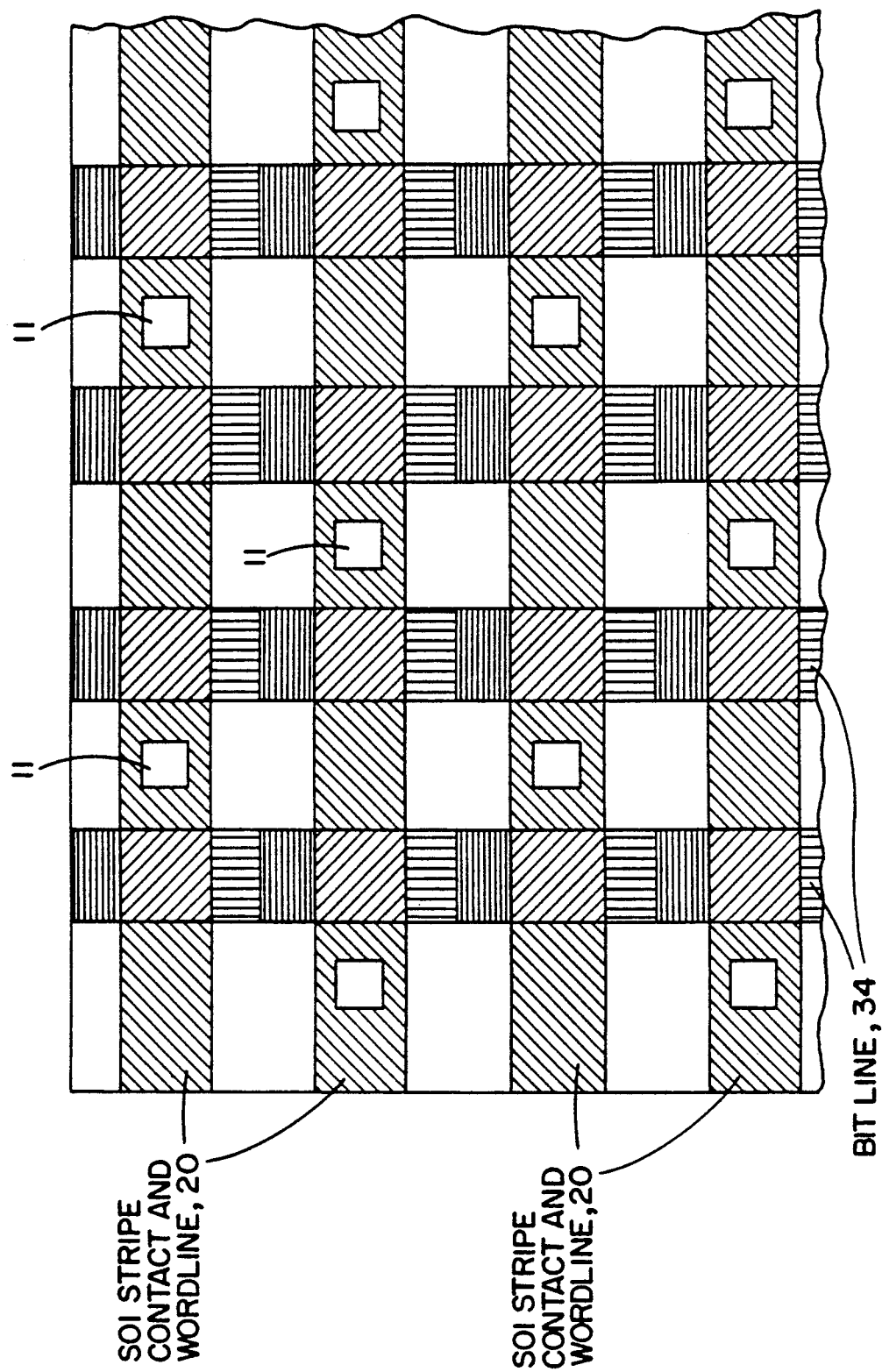
FIG. 10 illustrates a top view of a substrate contact mask that is used with a second embodiment of the invention.

To overcome this potential problem there is provided, in this second embodiment of the invention, a method to provide a contact to the self-aligned stripe between devices in the memory array. This contact connects the stripe to the underlying substrate 10 through the SOI oxide layer 14. This is accomplished through the use of additional masks that are aligned to the storage trench mask. A top view of the cell layout, showing the result of the use of the substrate contact mask, is shown in FIG. 10; the positions of the subsequently defined wordlines 20 and bitlines 34 are shown for reference purposes. In order to assure that the substrate contact mask does not short out the storage trench 12, and to account for a second order alignment of wordlines 20 to the trenches 12, the cell size is required to become larger. That is, for 0.35 micron groundrules the cell size increases to 0.75 microns by (0.7+0.28) microns, or 0.74 microns$^2$. The increase in cell size can be minimized through the use of a parylene or some other suitable liner to decrease the required size of the contact hole. Assuming that the minimum image that may be defined with this technique is 0.2 microns, then the cell size is 0.62 microns$^2$. For 0.5 micron groundrules the cell size for these two cases is 1.5 microns$^2$ and 1.2 microns$^2$, respectively.

Figure 9:
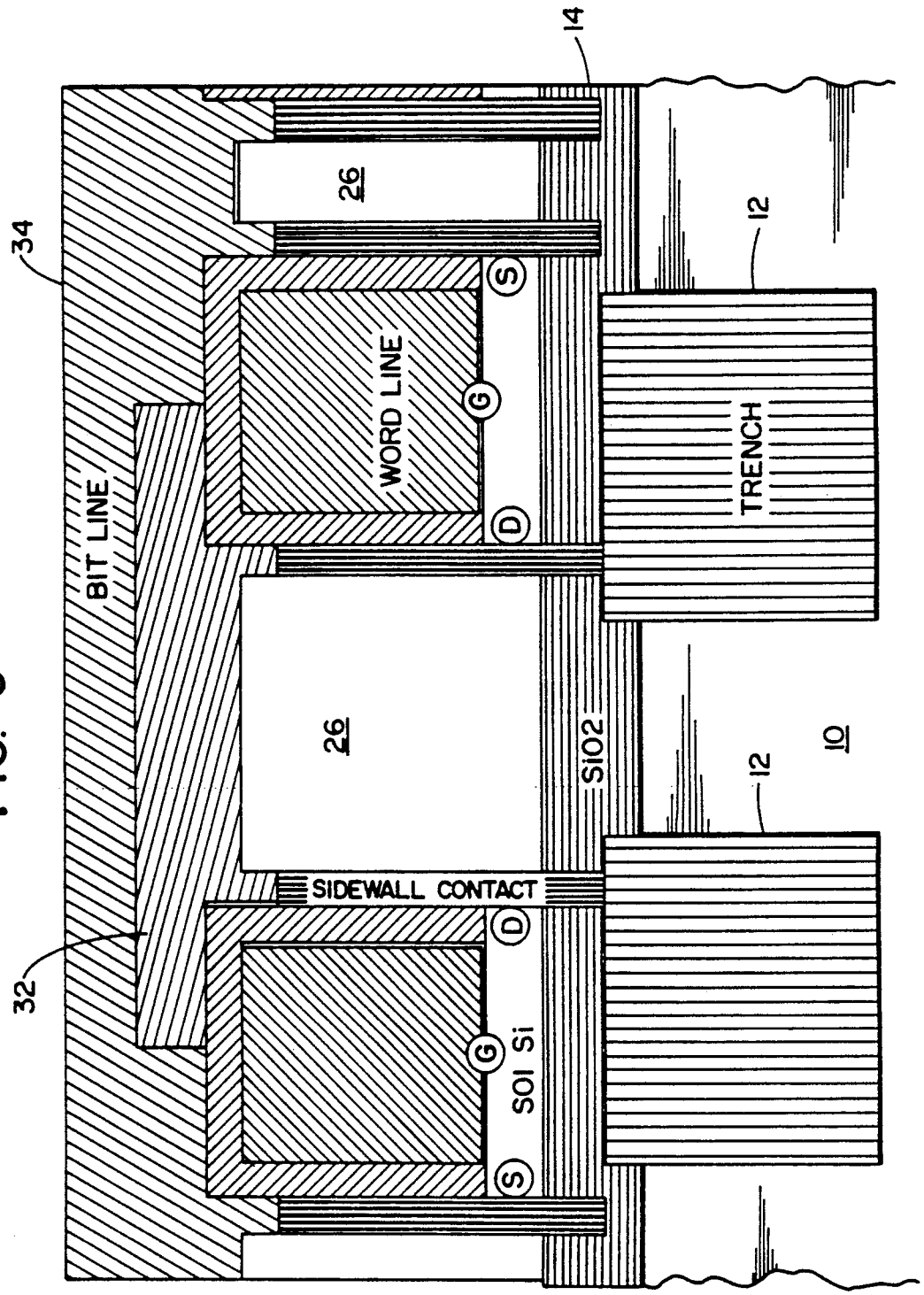
FIG. 9 shows a cross sectional view of another embodiment of a completed DRAM cell.

The second embodiment of the memory cell is shown in FIG. 9. This embodiment utilizes a shared contact for two devices and adds isolation space between the drains of two adjacent devices. This layout allows slightly looser ground rules at some processing levels and simplifies the processing slightly. The memory cell of FIG. 9 provides one bit of information in five unit areas instead of the four unit areas of the embodiment of FIG. 8.

Reference is made to the flowchart of FIGS. 11a and 11b as showing fabrication steps that are described in detail below. In general, and as in the first embodiment previously described, the processing steps form a deep charge storage trench that is buried beneath an oxide layer. On top of this structure a silicon-on-insulator (SOI) layer is formed to provide an active device region. An SOI island interconnect technique is also disclosed.

Step A. A first step is identical to Step A of the first embodiment and defines, etches, fills and planarizes trench charge storage nodes 12 within a p-type silicon substrate 10. The trenches have a depth of approximately six to nine microns, a top surface area dimension of approximately 0.8 microns on a side, and are filled with, by example, boron-doped p-type polysilicon.

Step B. A next step deposits a relatively thick (e.g. 200 nm) oxide layer 14 over the trench storage nodes 12.

Step C. Employing a SOI bonding and etchback technique, there is produced a thin layer 16 (e.g. 150 nm) of single crystal Si over the oxide layer 14 and the underlying trench storage nodes 12.

Step D. The SOI layer 16 is protected by the formation of an oxide layer 18. Layer 18 also serves as an isolation oxide later in the process.

Step E. As in the first embodiment, N-well regions are implanted at desired locations within the SOI layer 16, for p-channel devices, with the use of a block mask. Suitable implant species include arsenic or phosphorus and a suitable concentration is approximately $10^{15}$ atoms/cm$^3$. Also as previously described, the bottom portion of the SOI N-well regions, that is those portions nearest to the oxide layer 14, are implanted with additional n-type dopant to a concentration of approximately $10^{17}$ atoms/cm$^3$. This additional n-type dopant acts later in the process to interconnect to the channel region of p-channel devices.

Step F. P-well regions are implanted at desired locations within the SOI layer 16, for n-channel devices, with the use of a second block mask. A suitable implant species includes boron and a suitable concentration is approximately $10^{15}$ atoms/cm$^3$. As before, the bottom portion of the SOI P-well regions, that is those portions nearest to the oxide layer 14, are implanted with additional p-type dopant to a concentration of approximately $10^{17}$ atoms/cm$^3$. The additional p-type dopant acts later in the process to interconnect to the channel region of n-channel devices.

Figure 12:
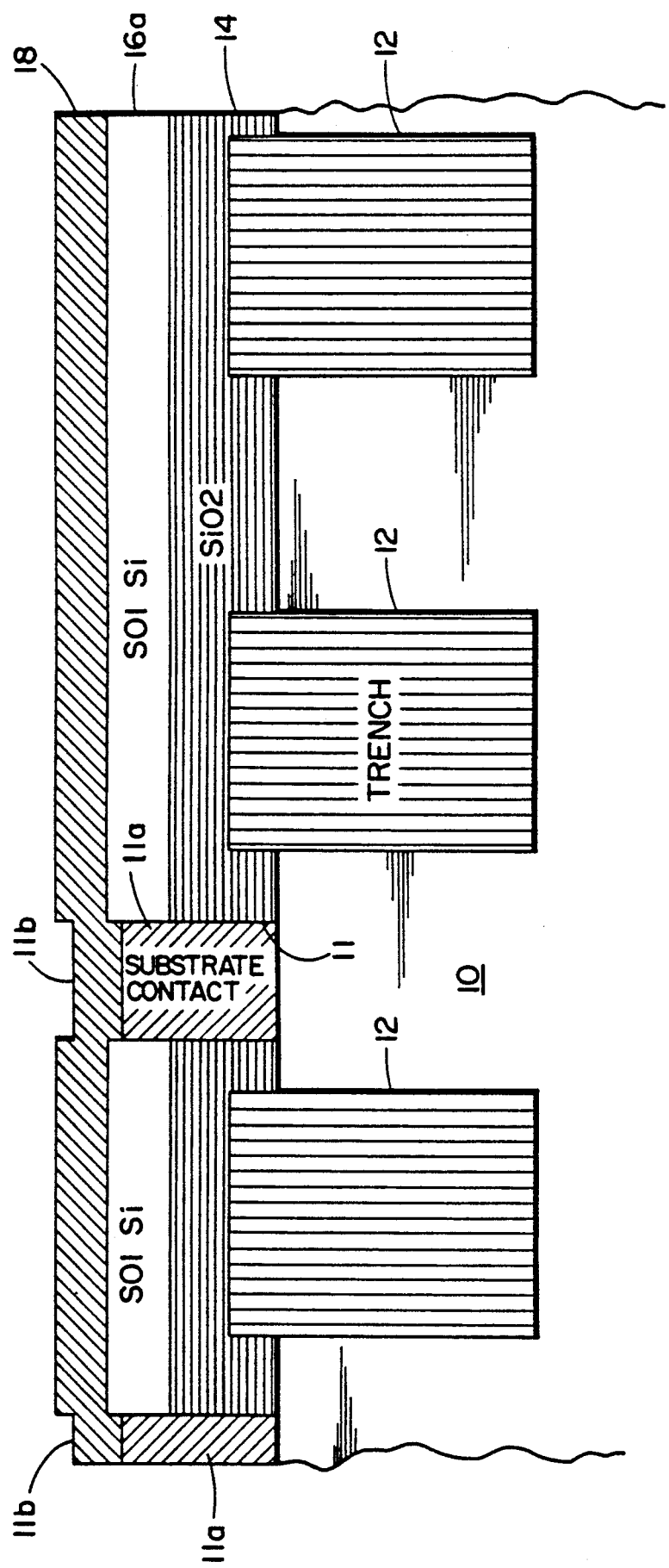
FIG. 12 is a cross sectional view of an array of partially fabricated DRAM cells showing a substrate contact that results from the use of the mask of FIG. 10.

Step G. A substrate contact mask is defined and is aligned to the underlying trenches. The layout of the substrate contact mask is shown in FIG. 10 and the result of the use of the substrate contact mask is shown in FIG. 12. The purpose of the substrate contact mask is to define vias or contact holes 11 for coupling the subsequently formed SOI silicon strip 16a to the substrate 10 at a plurality of spaced locations down the length of the strip.

Step H. Next, the isolation oxide 18, the SOI layer 16, and the SOI insulator 14 are etched within each contact hole 11. This step of etching exposes the silicon substrate 10 at the bottom of each contact hole 11, as defined by the substrate contact mask.

Step I. Next, p+ polysilicon 11a is deposited within the contact holes 11 (assuming an n-channel array device), thereby conductively coupling the SOI silicon to the substrate 10.

Step J. The deposited polysilicon 11a is planarized and recessed slightly while maintaining contact between the polysilicon 11a and the SOI 16 silicon.

Step K. An additional 50 nm of isolation oxide 11b is deposited to passivate the substrate contact from a subsequently deposited wordline. If desired, planarization of the passivation may also be done at this time.

Having formed the substrate contacts 11 subsequent processing of the array continues as from Step I of FIG. 1a. The subsequent processing steps include the following.

Step L. The SOI island isolation mask is defined and the layer of isolation oxide 18 is etched. As before, this mask defines linear oxide patterns 18a that run parallel to subsequently formed bitlines. The linear patterns 18a are aligned to the space between the buried trench storage nodes 12.

Step M. A layer of gate oxide is formed.

Step N. The wordlines 20 are defined, deposited, and capped with 300 nanometers of oxide prior to masking. The passivation spacer 22 having a thickness of, for example, 50 nm is formed over the wordlines 20 and Reactive Ion Etched (RIE'd) such that the wordlines 20 are each encapsulated with oxide and the SOI silicon between wordlines is exposed. The previously formed contact holes 11 now underlie the wordlines.

Step O. Next, n+ source/drains are implanted via a block mask. Also, p+ source/drains are implanted via a block mask.

Step P. A thermal anneal drive cycle is performed to activate the dopant and out-diffuse the dopant under the spacer 22. This provides overlap with the overlying wordline to assure proper FET operation. Next, the exposed portions of the isolation oxide 18 and the exposed SOI silicon 16 are RIE'd, thereby forming the SOI silicon strips 16a, each of which is coupled at a plurality of locations to the substrate 10 by the contact holes or vias 11.

Step Q The sacrificial spacer 24 is formed which defines the placement of the sidewall contacts to both the source and drain of the transfer device. As before, $SiO_2$ may be employed for the passivation spacer 22 and $Si_3N_4$ for the sacrificial spacer 24.

Step R. The sub-optical, image reversed SIT mask is aligned to the trench space along the intended bitline direction and is, therefore, also aligned to the previously defined isolation oxide. FIG. 4 illustrates the orthogonal cross-sectional view along the edge of the wordline 20 and shows the sub-lithographic cuts 24a.

Step S. The remaining gaps in the memory cell array are filled with the conformal insulator material 26. As shown in FIG. 5, the conformal insulator material 26 is planarized such that the top of the sacrificial spacer 24 is exposed.

Step T. The exposed portion of the sacrificial spacer 24 is removed with an appropriate etchant, such as hot $H_3PO_4$.

Step U. A RIE oxide etch is employed to etch the oxide on the buried trench storage nodes 12, thus exposing the polysilicon within the trench. The alignment of each of the wordlines 20 to the underlying trench 12 allows the opening of a contact only to the drain of the device, as shown in FIG. 6.

Step V. Next, the sidewall contacts 28 are formed. This step is accomplished by depositing the conformal film, such as polysilicon, to refill the spacer gaps and then planarizing and recessing the polysilicon as shown in FIG. 7. The node is thus electrically connected to the polysilicon within each trench 12, and a contact 28a for a subsequently formed bitline is bought up to approximately the top of the wordline 20.

Step W. The additional layer 32 of passivation oxide is next deposited.

Step X. A mask is patterned so as to etch the oxide layer 32 to expose the sidewall bitline contact 28a.

Step Y. The bitline 34 conductor is deposited to provide the structure shown in FIG. 8. All subsequent processing of the memory array is conventional.

FIG. 9 illustrates the second embodiment for the memory cell constructed in accordance with the invention. This memory cell embodiment provides one bit of information in five unit areas instead of four unit areas.

Having thus described two processing embodiments of the invention a third embodiment is now described. This embodiment of the invention provides a SOI DRAM cell which utilizes an electrically conductive SOI silicon plane, in conjunction with substrate contacts 13, to provide a source of electrons to the active device channel regions to further minimize the floating substrate effect. As before, this third embodiment of the invention employs a surface SOI transfer device with an underlying buried trench charge storage node and the vertical sidewall contact structure. The DRAM memory cell thus formed also provides one bit of information storage within four unit areas, as compared to the eight unit areas required for a conventional DRAM cell.

More specifically, this embodiment of the invention describes a DRAM cell which provides a conductive plane of SOI silicon to provide charge carriers to active device channels to suppress the floating substrate effect. In the first embodiment described above a stripe of SOI silicon runs beneath and is self-aligned to the wordline to provide such a contact. In the second embodiment described above additional contacts (11) between the stripe and the substrate 10 are provided to assure that the stripe is not cut off from an associated power supply due to depletion regions of the devices reaching through to the buried SOI oxide 14.

Figure 2A:
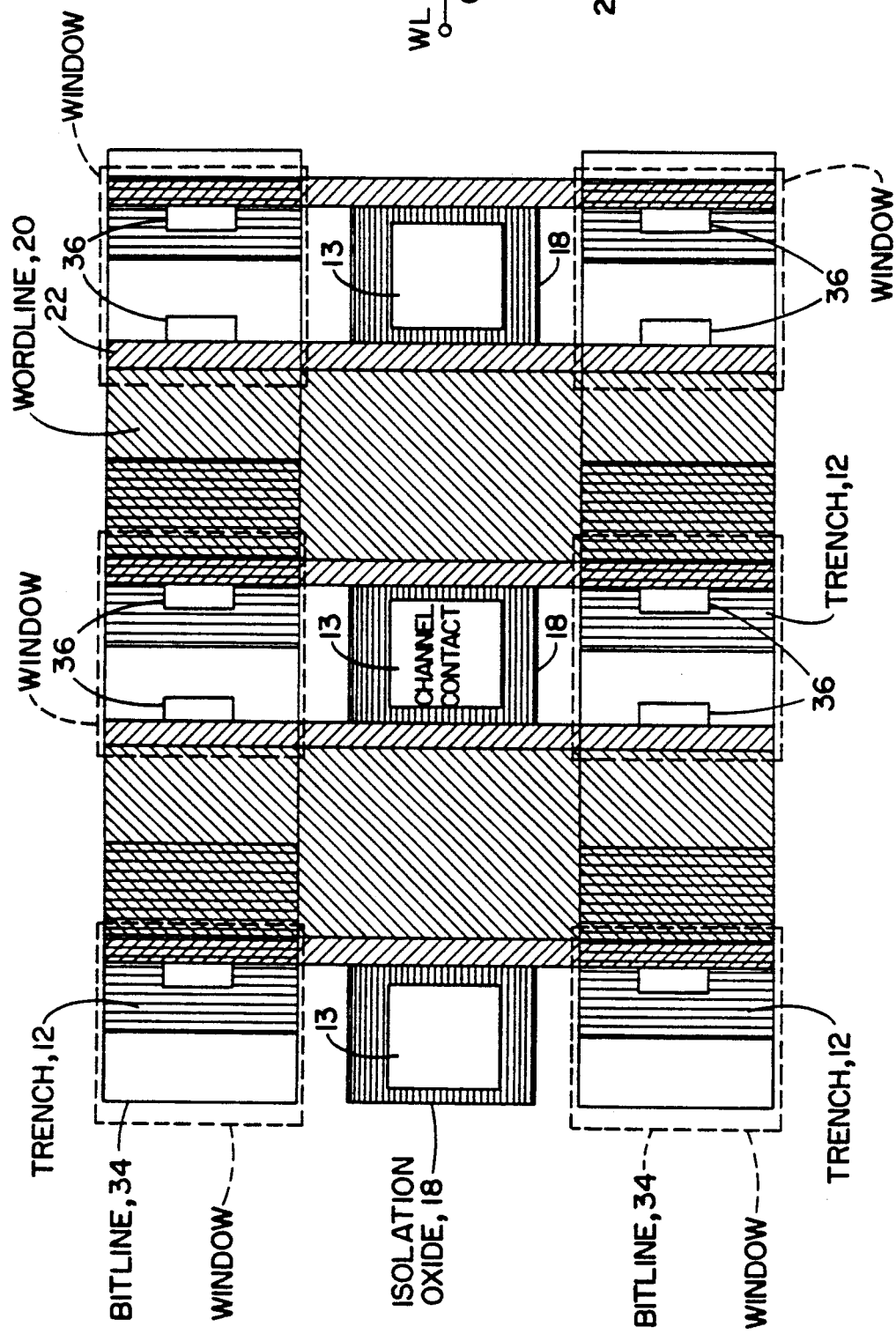
FIG. 2a is a top view of a portion of a DRAM array constructed in accordance with a third embodiment of the invention.

The conducting plane 16b of this embodiment is most clearly seen in the top view of FIG. 2a and provides contact to the channel region of each device through more than one path. As a result, for some memory arrays constructed in accordance with this embodiment of the invention it may be determined that contacts from the SOI channels down to the substrate 10 are not required. In such a case, the minimum required cell size is 0.5 microns$^2$ with 0.35 micron groundrules, as in the first embodiment described above. If the channel contact to the substrate 10 is required, then the cell size increases to 0.69 microns$^2$ due to overlay requirements between the substrate contact and the underlying trench storage node 12. If the size of the contact is reduced below minimum groundrules, for example to 0.2 microns through the use of a liner for the contact hole, then the required cell size is reduced to 0.58 microns$^2$. Similarly, utilizing 0.5 micron groundrules, the cell is 1.0 micron$^2$ if no channel contact to substrate is required, 1.4 micron$^2$ if a full size contact to channel is utilized, and 1.1 micron$^2$ if a 0.2 micron wide channel contact is employed.

Figure 13A:
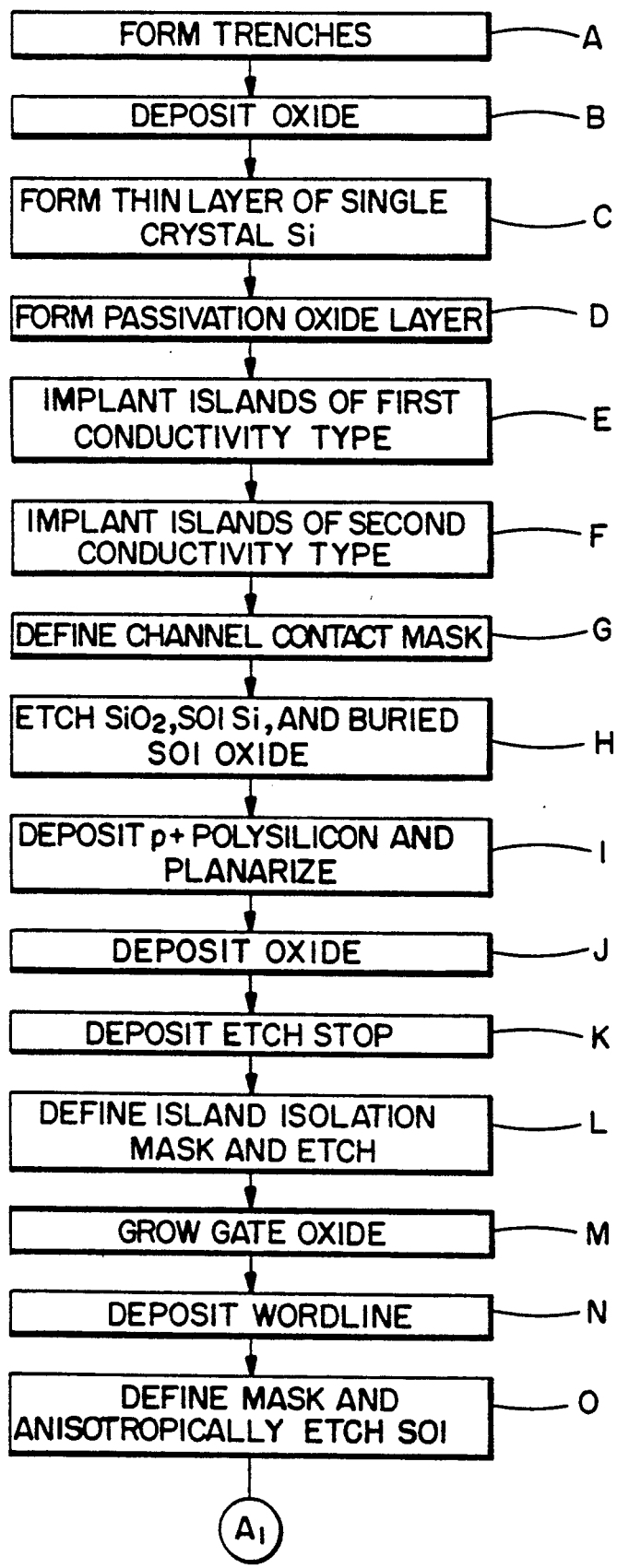
FIGS. 13a and 13b depict semiconductor fabrication steps in accordance with a third processing method of the invention.
Figure 13B:
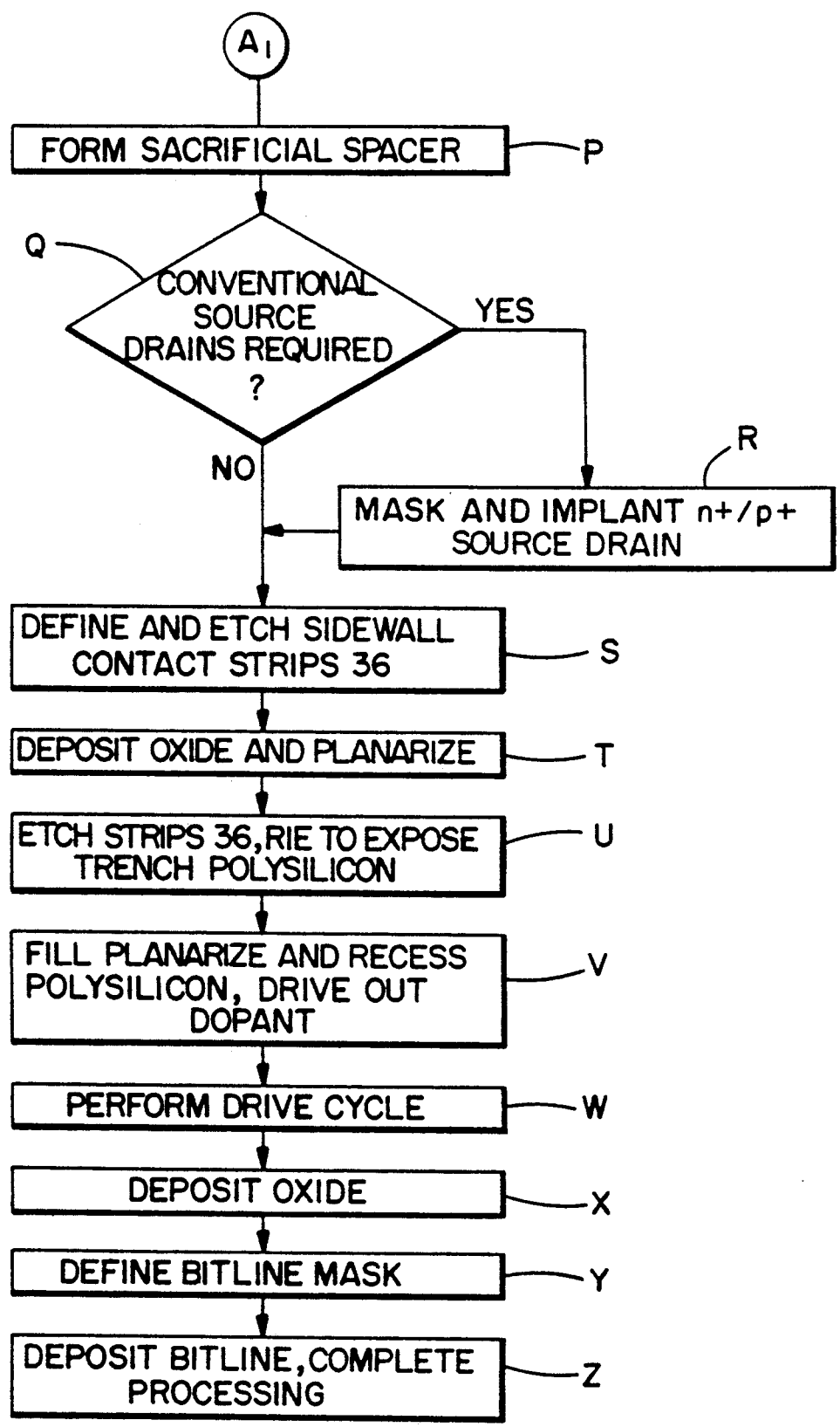

The processing steps for this third embodiment are described below in relation to FIGS. 13a and 13b. Additional steps which provide contacts (13) from the SOI channels down to the substrate 10 are included as Steps G, H, I and J. However, as mentioned above, these steps could be eliminated if it is determined that the substrate contacts 13 are not required for a particular application.

Figure 11A:
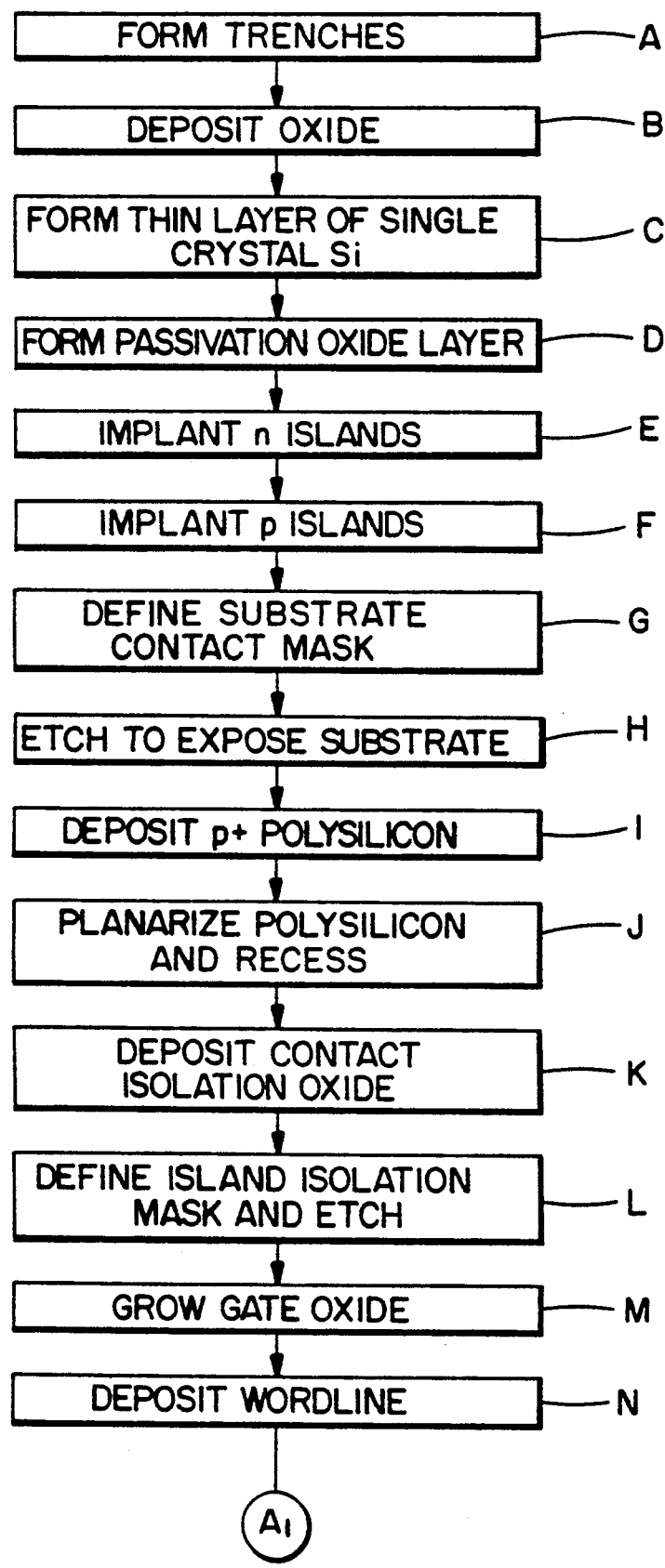
FIGS. 11a and 11b depict semiconductor fabrication steps in accordance with a second processing method of the invention.
Figure 11B:
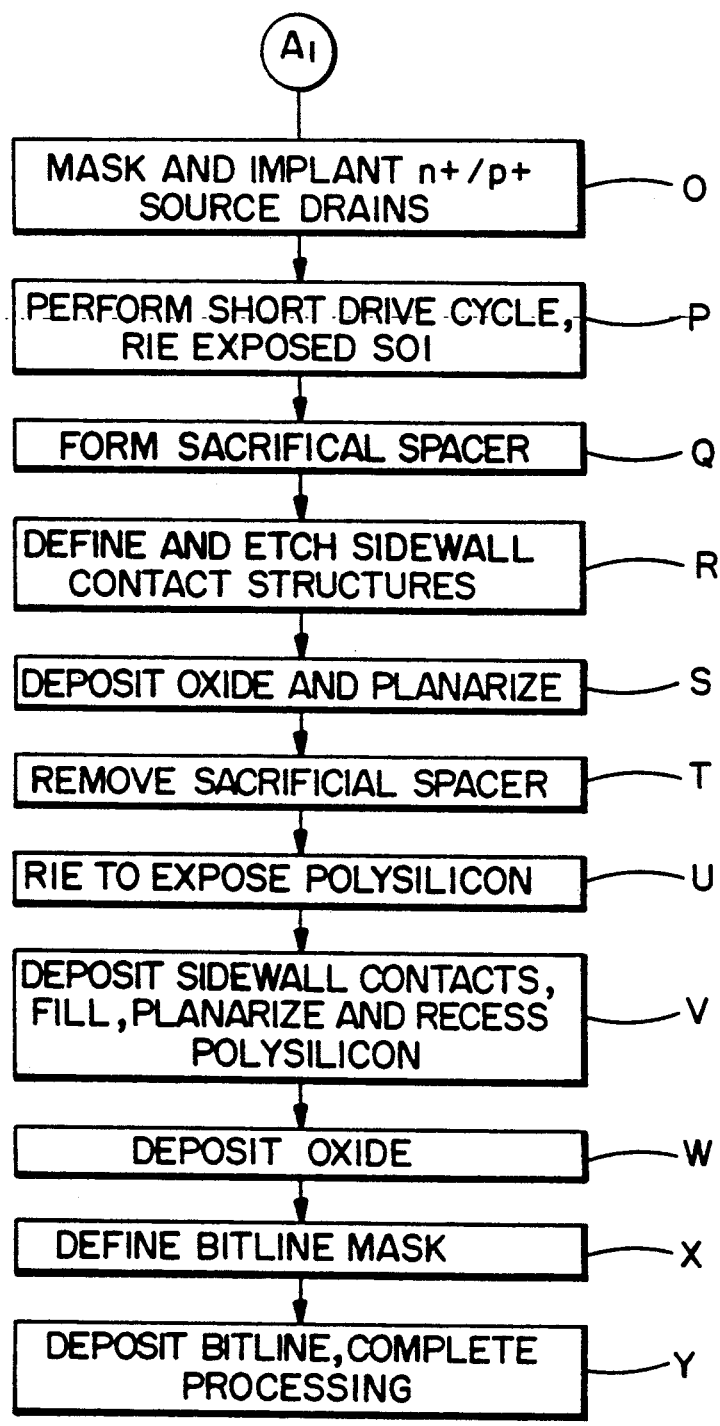

Steps A-F are performed identically to Steps A through F of FIG. 11a, including the provision of the more heavily implanted region at the bottom of the SOI silicon layer 16 adjacent to the SOI oxide 14.

Step G. A channel contact mask is defined and is aligned to the underlying trenches. The result of the use of the channel contact mask is shown in the top view of FIG. 2a, wherein it can be seen that a plurality of channel contacts 13 are defined between the buried trench storage nodes 12.

Step H. Next, the isolation oxide 18, the SOI layer 16, and the SOI insulator 14 are etched within each defined channel contact 13 region. This step of etching exposes the silicon substrate 10 at the bottom of each contact location.

Step I. Next, p+ polysilicon 13a is deposited within the contact area (assuming an n-channel array device). The deposited polysilicon 13a is planarized and recessed while maintaining contact between the polysilicon 13a and the SOI 16 silicon.

Step J. An additional 50 nm of isolation oxide 13b is deposited to passivate the substrate contact 13.

Step K. An etch stop, such as $Al_2O_3$, is uniformly deposited.

Step L. The SOI island isolation mask is defined and the layer of $Al_2O_3$ and isolation oxide 18 is etched. As before, this mask defines linear oxide patterns that run parallel to subsequently formed bitlines and which are aligned to the space between the buried trench storage nodes 12. The SOI beneath the isolation oxide assures that there are multiple paths from substrate to channel.

Step M. The layer of gate oxide 19 is formed.

Step N. The wordlines 20 are defined, deposited, and capped with 300 nanometers of oxide prior to masking. A passivation spacer 22 having a thickness of, for example, 50 nm is formed over the wordlines 20 and Reactive Ion Etched (RIE'd) such that the wordlines 20 are each encapsulated with oxide and the surface of the SOI silicon layer 16 between wordlines is exposed.

Step O. Next, a mask is defined and employed to anisotropically etch the SOI silicon so as to open windows within which subsequent processing occurs. As is best seen in the view of FIG. 2a the mask is aligned such that the etched windows are located between the previously defined isolation patterns. The windows provide the dual functions of (a) providing isolation between devices in the direction of the wordline and, (b) providing an area within which subsequently defined source/drains are positioned. The previously deposited $Al_2O_3$ provides an etch barrier to prevent inadvertent etching of the SOI silicon beneath the isolation oxide 18. The etch stop is optional when a contact is utilized between the island and the substrate 10, but required if no such contact is utilized. After the completion of Step O the structure resembles that shown in FIG. 3, but without the n+ diffusions.

It should be noted that the portion of the SOI silicon layer 16 that remains after the windows are opened functions as the conductive plane 16b which is, optionally, repetitively coupled to the substrate 10 via the substrate contacts 13.

Step P. Next, the sacrificial spacer is formed on the edge of the polysilicon wordline 20 within the previously opened window area. The material must withstand high temperatures before it is eventually removed. $SiN_4$ is one appropriate material.

Step Q. If conventional source/drains are required in the supporting circuitry, then Step R is performed where n+/p+ source/drains are masked and implanted.

Figure 14:
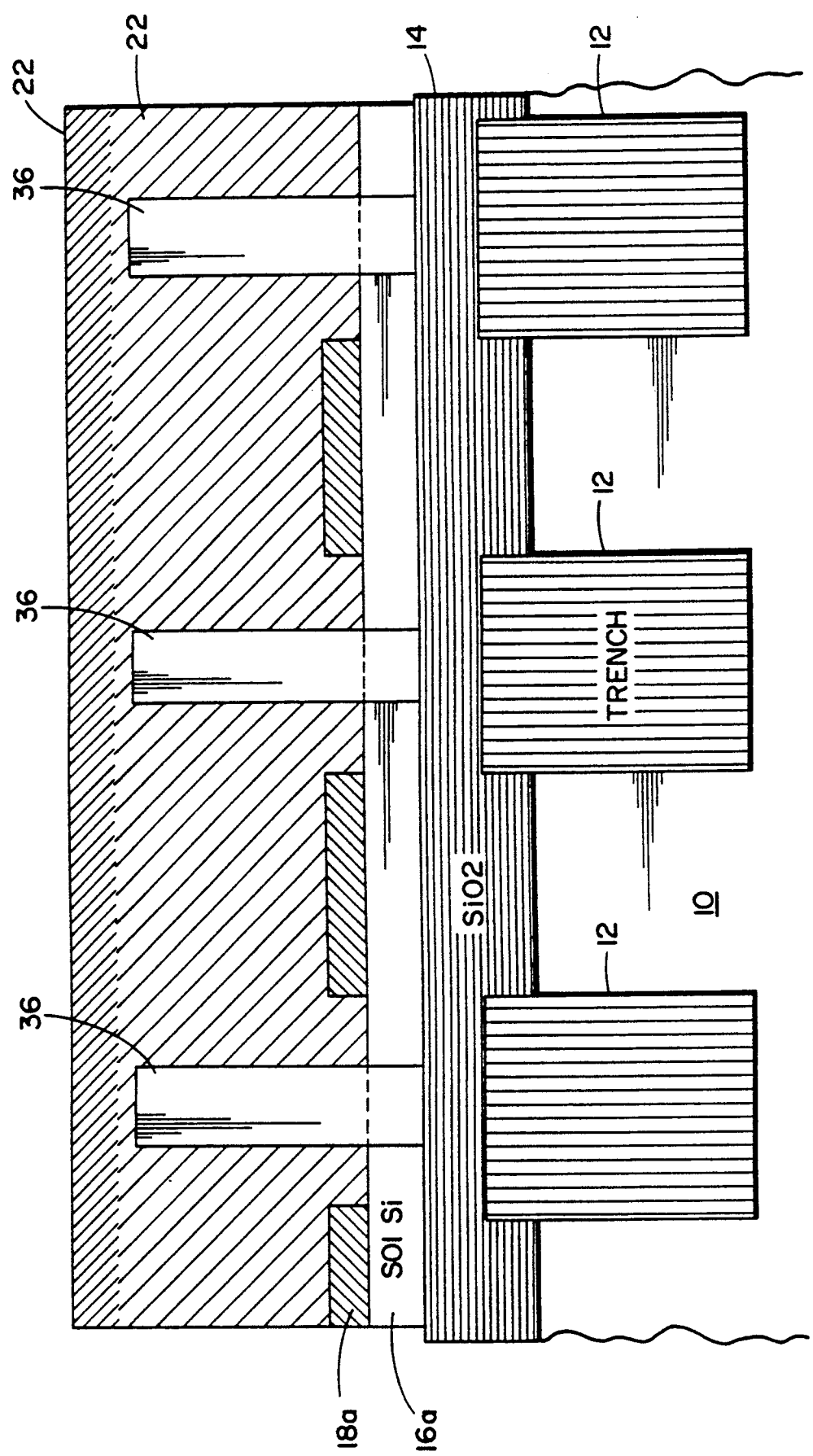
FIG. 14 is a cross-sectional view of a portion of an array of DRAM cells showing a sublithographically defined vertical sidewall strip that is employed for making a vertical sidewall connection.

Step S. A SIT sub-optical image is defined to be, for example, 0.20 microns wide and to run orthogonal to the word line. The SIT sub-optical image is aligned to the center of the mesa mask in the bitline dimension. Next, the sacrificial spacer material is etched, leaving narrow strips 36 of the material running up the edge of wordline and aligned to the center of the active device channel. As can be seen in FIG. 14, these narrow strips 36 define a region that eventually provides a dopant source for, as well as a contact to, the source and drain terminals of the access transistor.

It is noted that the first two embodiments employ an implant to provide the n+(p+) diffusion dopant. The unwanted dopants are subsequently removed during the RIE step. The SIT image is employed to define where contact is made to the diffusions. Thus, relatively large areas are preferred in order to provide adequate margins for achieving contact.

In contradistinction, the cell employed by the third embodiment relies on the out-diffusion of dopants from polysilicon that is deposited within regions defined by the narrow strips 36, as will be described below in Steps T and V. These dopants out-diffuse in all directions and are not later removed where not wanted. Thus, alignment of the strip 36 in FIG. 14 is an important consideration in that it is not desirable that the dopant diffuse beneath the isolation. That is, it is desired that the dopant remain within the mesa window. Also, in order to minimize cell size, a minimum width, such as 0.2 microns, is required for the strip 36.

As a result, it should be realized that the strips 24 in FIG. 4 may be as narrow as the strips 36 in FIG. 14, but the reverse is not generally true.

Step T. The openings defined by the window etch (Step O) are filled with deposited oxide and planarized. After this step the structure appears as in FIG. 5. The remaining sacrificial spacer 22 material (the strips 36) is then etched. This results in the formation of opposing holes aligned to the edges of the wordline 20, one of which is in registration with the underlying trench 12.

Step U. An RIE oxide etch is used to etch the oxide over the buried trench 12, thus exposing the trench polysilicon. The alignment of each wordline 20 to the underlying trench 12 beneficially allows the opening of a contact only to the node side of the device, as shown in FIG. 6.

Step V. Next, the each of the openings formed in Steps T and U are filled with degenerately doped polysilicon. This is followed by a step of planarizing and recessing. An annealing step is performed to drive out the dopant in the deposited polysilicon to form the source/drain of the array device and whatever support devices are desired. If both types (n+/p+) of sidewall spacer diffusions are required an additional mask is utilized to remove the sacrificial spacer for one type of diffusion at a time.

Step W. A short thermal anneal drive cycle is utilized to assure overlap of the source/drain dopant to the gate. A cross-sectional view through the active device of the array, at this point in the processing cycle, is shown in FIG. 7.

Step X. Another layer of passivation oxide is deposited.

Step Y. A mask is patterned which allows the etching of a contact for a subsequently formed bitline.

Step Z. A conductor is then deposited and defined to provide the bitline 32 as in FIG. 8. Subsequent processing of the memory array is conventional.

Although described in the context of specific embodiments it should be realized that modifications may be made to the disclosed method steps and materials while yet achieving the same result. For example, another SOI technique for producing quality Si could be used, such as that disclosed by Onada et al. in an article entitled "Si gate CMOS Devices on a $Si/CaF_2/Si$ Structure", IEEE Trans. on Elec. Dev., ED34, No. 11, 1987.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new, and desire to secure by Letters Patent is:

1. A semiconductor memory cell, comprising:

a substrate;

an electrically conductive region formed at least partially within the substrate and dielectrically isolated therefrom;

a first layer comprised of electrically insulating material formed over the substrate and over the electrically conductive region; and a second layer comprised of a semiconductor material overlying the first layer, the second layer being differentiated into a plurality of active device regions each of which is disposed above one of the electrically conductive regions; wherein each of the active device regions is coupled to an overlying first electrode means for forming a first node of an access transistor, each of the active device regions is coupled to a second electrode means for forming a second node of the access transistor; and each of the active device regions is coupled to the underlying electrically conductive region for forming a third node of the access transistor, wherein the first electrode means includes a pair of opposed, electrically insulating vertical sidewalls, and wherein the second node and the third node of each of the access transistors are each comprised of an electrical conductor disposed upon opposite ones of the vertical sidewalls.

2. A semiconductor memory cell as set forth in claim 1 wherein the first electrode means includes a wordline and wherein the second electrode means includes a bitline.

3. A semiconductor memory cell as set forth in claim 1 wherein the substrate is comprised of p-type monocrystalline silicon and wherein the electrically conducting region is comprised of p-type polycrystalline silicon.

4. A semiconductor memory cell as set forth in claim 1 wherein each of the active device regions is coupled to means for electrically coupling the active device region to the substrate for providing charge carriers thereto.

5. A semiconductor memory cell as set forth in claim 4 wherein the means for electrically coupling each of the active device regions to the substrate includes an electrically conductive contact that is vertically coupled between the second layer and the substrate.

6. A semiconductor memory cell as set forth in claim 4 wherein the means for electrically coupling each of the active device regions to the substrate includes a region comprised of an electrically conductive material that is disposed within the second layer at a position adjacent to the first layer.

7. A semiconductor memory cell as set forth in claim 4 wherein the means for electrically coupling each of the active device regions to the substrate includes an electrically conductive contact that is vertically coupled between the second layer and the substrate, and wherein the means for electrically coupling each of the active device regions to the substrate further includes a region comprised of an electrically conductive material that is disposed within the second layer at a position adjacent to the first layer.

8. A semiconductor memory cell as set forth in claim 1 having features of a first minimum photolithographic dimension, and wherein the electrical conductors disposed upon the vertical sidewalls have a second minimum dimension that is less than the first minimum photolithographic dimension.

9. A method of fabricating an array of dynamic random access memory cells, comprising the steps of:

providing a substrate;

forming a plurality of trench capacitors within the substrate; and fabricating a plurality of access transistors, individual ones of which overlie and are electrically coupled to one of the trench capacitors; the step of fabricating including the steps of, forming a silicon-on-insulator (SOI) region over the substrate and trench capacitors, the SOI region including a layer of silicon and an insulating layer that is interposed between the layer of silicon and the substrate;

differentiating the silicon layer into a plurality of active device regions, individual ones of which are disposed over one of the trench capacitors;

forming a wordline conductor over a plurality of active device regions, the wordline conductor being formed to include a pair of opposed, electrically insulating, vertical sidewalls; and fabricating a plurality of sublithographic electrical conductors upon the vertical sidewalls such that one of the electrical conductors couples one of the trench capacitors to the overlying active device region, and such that another of the electrical conductors couples the active device region to a subsequently fabricated overlying bitline conductor.

10. A method as set forth in claim 9 wherein the step of providing a substrate provides a substrate comprised of p-type monocrystalline silicon, and wherein the step of forming a plurality of trench capacitors forms, within the substrate, a plurality the electrically conducting regions comprised of p-type polycrystalline silicon.

11. A method as set forth in claim 9 wherein the step of differentiating includes a step of electrically coupling the active device regions to the substrate.

12. A method as set forth in claim 11 wherein the step of electrically coupling the active device regions to the substrate includes the steps of:

forming an opening through the silicon layer to the substrate; and filling the opening with an electrically conductive material.

13. A method as set forth in claim 11 wherein the step of electrically coupling active device regions to the substrate includes a step of:

forming, within the silicon layer, a substrate contact plane comprised of an electrically conductive material.

14. A method as set forth in claim 11 wherein the step of electrically coupling the active device regions to the substrate includes the steps of:

forming an opening through the silicon layer to the substrate;

filling the opening with an electrically conductive material; and forming, within the silicon layer, a substrate contact plane comprised of an electrically conductive material.

15. A method as set forth in claim 9 wherein the step of forming a SOI region includes the steps of:

performing a first implant at a first dopant concentration into the silicon layer; and performing a second implant into the silicon layer at a second dopant concentration, the second implant being positioned adjacent to the insulating layer, and wherein the second dopant concentration is greater than the first dopant concentration.

16. A method as set forth in claim 9 wherein the step of differentiating the silicon layer into a plurality of active device regions includes a step of implanting access transistor source and drain regions.

17. A method as set forth in claim 9 wherein the step of fabricating a plurality of sublithographic electrical conductors includes a step of forming access transistor source and drain regions by a step of diffusing a dopant out from the plurality of sublithographic electrical conductors.

18. A method as set forth in claim 9 wherein the step of forming a wordline conductor over a plurality of active device regions includes a step of removing the silicon layer except where the silicon layer underlies the wordlines.

19. A method as set forth in claim 9 wherein the step of forming a plurality of trench capacitors forms the trench capacitors as a two dimensional array of trench capacitors, and wherein the step of differentiating the silicon layer into a plurality of active device regions includes a step of forming a plurality of linear isolation regions, individual ones of which are disposed between two adjacent rows of trench capacitors and orthogonally to the subsequently formed wordlines.

20. A method as set forth in claim 9 wherein the step of fabricating a plurality of access transistors fabricates each of the access transistors within two lithographic units.

21. A method as set forth in claim 9 wherein the step of forming a wordline conductor over a plurality of active device regions is followed by a step of opening a plurality of windows within the silicon layer, and wherein the step of fabricating a plurality of sublithographic electrical conductors occurs within the windows.

22. A method of fabricating an array of memory cells, comprising the steps of:
providing a Si substrate;
fabricating a plurality of trench capacitors within the substrate;
forming a silicon-on-insulator (SOI) region over the substrate and trench capacitors, the SOI region including a layer of insulator that is interposed between the substrate and a Si layer;
fabricating a plurality of access transistor channel regions within the Si layer, individual ones of which overlie one of the trench capacitors; and
forming a plurality of wordlines, each having two opposing vertical sidewalls and each being formed over a plurality of the access transistor channel regions, each wordline being conductively coupled to a gate terminal of each of the underlying access transistor channel regions; and
fabricating a plurality of vertical electrical contacts along both of the vertical sidewalls of the wordline, wherein for a particular one of the access transistor channel regions a first vertical contact electrically couples the channel region to the underlying a trench capacitor, and wherein a second vertical contact, disposed upon the opposite vertical sidewall, electrically couples the active device channel region to an overlying bitline conductor.

23. A method as set forth in claim 22 wherein the step of forming a SOI region includes a step of implanting the Si layer such that a heavier dopant concentration occurs in a region thereof that is adjacent to the insulator layer.

24. A method as set forth in claim 23 and including a step of conductively coupling the region of the Si layer to the Si substrate.

25. A method as set forth in claim 24 wherein the step of forming a plurality of wordlines removes the Si layer except for regions beneath the wordlines, and wherein the step of conductively coupling includes a step of forming a plurality of substrate contacts at a plurality of locations that are selected to lie beneath each subsequently formed wordline.

26. A method as set forth in claim 22 wherein the step of fabricating a plurality of vertical electrical contacts along both of the vertical sidewalls of the wordline includes an initial step of defining the position of each of the vertical electrical contacts through the use of a sidewall image transfer sub-optical mask.

27. A method as set forth in claim 22 wherein the step of fabricating a plurality of access transistor channel regions within the Si layer includes a step of implanting access transistor source and drain regions.

28. A method as set forth in claim 22 wherein the step of fabricating a plurality of vertical electrical contacts includes a subsequent step of forming access transistor source and drain regions by a step of diffusing a dopant out from the plurality of vertical electrical contacts.

* * * * *